United States Patent [19]

Corzine et al.

[11] Patent Number: 5,896,408

[45] Date of Patent: Apr. 20, 1999

[54] NEAR PLANAR NATIVE-OXIDE VCSEL DEVICES AND ARRAYS USING CONVERGING OXIDE RINGLETS

[75] Inventors: Scott W. Corzine, Sunnyvale; Richard P. Schneider, Jr., Mountain View; Michael R. T. Tan, Menlo Park, all of Calif.

[73] Assignee: Hewlett-Packard Company, Palo Alto, Calif.

[21] Appl. No.: 08/911,708

[22] Filed: Aug. 15, 1997

[51] Int. Cl.$^6$ .............. H01S 3/19; H01S 3/08; H01L 21/20

[52] U.S. Cl. .............. 372/46; 372/96; 372/50; 438/34

[58] Field of Search .............. 372/45, 46, 96, 372/92, 99, 50; 438/34

[56] References Cited

U.S. PATENT DOCUMENTS

| | | | |
|---|---|---|---|
| 5,359,618 | 10/1994 | Lebby et al. | 372/45 |
| 5,373,522 | 12/1994 | Holonyak, Jr. et al. | 372/46 |
| 5,493,577 | 2/1996 | Choquette et al. | 372/45 |
| 5,719,891 | 2/1998 | Jewell | 372/45 |
| 5,719,892 | 2/1998 | Jiang et al. | 372/45 |

Primary Examiner—Rodney Bovernick
Assistant Examiner—Quyen Phan Leung

[57] ABSTRACT

A VCSEL with a near planar top surface on which the top electrode is deposited. A VCSEL according to the present invention includes a top electrode, a top mirror having a top surface, a light generation region, and a bottom mirror for reflecting light toward the top mirror. At least one of the mirrors includes a plurality of planar electrically conducting layers having different indices of refraction. In addition, at least one of the layers includes an oxidizable material. To expose this layer to an oxidizing agent (thereby converting the material to an electrical insulator), three or more holes are etched down from the top surface of the VCSEL to the layer containing the oxidizable material. The oxidizing agent is then introduced into the top of these holes. The partial oxidation of the layer converts the layer to one having a conducting region surrounded by an electrically insulating region, the conducting region being positioned under the top electrode.

10 Claims, 3 Drawing Sheets

NEAR PLANAR NATIVE-OXIDE VCSEL DEVICES AND ARRAYS USING CONVERGING OXIDE RINGLETS

FIELD OF THE INVENTION

The present invention relates to semiconductor-based lasers, and more particularly, to Vertical Cavity Surface-Emitting Lasers.

BACKGROUND OF THE INVENTION

Semiconductor laser diodes were originally fabricated in a manner that led to a diode structure that was parallel to the surface of the semiconductor wafer. In this structure, light is emitted from the edge of the structure such that the light is also emitted parallel to the surface of the semiconductor wafer. Unfortunately, this structure does not lend itself to low cost "mass" manufacturing or to the cost-effective fabrication of two-dimensional arrays of laser diodes.

A second class of laser diodes is fabricated such that the laser structure is perpendicular to the surface of the semiconductor wafer and the light is emitted perpendicular to the surface. These laser diodes are commonly known as Vertical Cavity Surface-Emitting Lasers (VCSELs). A VCSEL may be viewed as a laser having mirrors constructed from alternating layers of material having different indices of refraction. These lasers are better suited for the fabrication of arrays of lasers for displays, light sources, optical scanners, and optical fiber data links. Such lasers are currently being considered for use in CD-ROM drives, DVD heads, and laser printers.

To provide small diameter light beams while maintaining efficient conversion of electrical energy to light, the current flowing vertically in the VCSEL must be confined to a small area. Early designs utilized ion-implanted regions to contain the current flow; however, this approach is not satisfactory for very small confinement areas. In addition, implanted regions do not offer any index-guided optical confinement.

A method for containing the current flow and also for providing optical confinement is to convert a portion of one or more of the mirror layers in the upper mirror to an electrical insulator. These VCSELs utilize an oxidation process to convert one or more high aluminum content layers within the VCSEL structure to some form of aluminum oxide. The oxidation process proceeds along the layer from the outer edge of an etched mesa toward the center of the mesa. The process is stopped prior to converting the entire layer, thereby leaving a small unoxidized area in the center of the mesa, which defines the laser aperture.

One problem with these native-oxide VCSELs is the nonplanar geometry currently employed in fabricating such devices. To provide access to the layer being oxidized, the device is first etched to form a mesa-like structure with the edges of the various mirror layers exposed. The exposed edges are then subjected to the wet oxidation process.

If a number of lasers are to be constructed on a common substrate, this process leads to a device in which each laser is an isolated mesa on the substrate. The surface of the device has large steps which make the deposition of the various metallic conductors, such as those used for contacts, difficult. In addition, the need to provide trenches between the devices limits the density of lasers that can be fabricated in array structures. Even in the case of single devices, the raised mesa structures make it difficult to deposit metal for the connections to the electrode on top of the mesa.

Broadly, it is the object of the present invention to provide an improved VCSEL structure and method for fabricating the same.

It is a further object of the present invention to provide a VCSEL structure that provides a near planar top surface.

These and other objects of the present invention will become apparent to those skilled in the art from the following detailed description of the invention and the accompanying drawings.

SUMMARY OF THE INVENTION

The present invention is a VCSEL with a near planar top surface on which the top electrode is deposited. A VCSEL according to the present invention includes a top electrode, a top mirror having a top surface, a light generation region, and a bottom mirror for reflecting light toward the top mirror. At least one of the mirrors includes a plurality of planar electrically conducting layers having different indices of refraction. In addition, at least one of the layers includes an oxidizable material. To expose this layer to an oxidizing agent (thereby converting the material to an electrical insulator) three or more holes are etched down from the top surface of the VCSEL to the layer containing the oxidizable material. The oxidizing agent is then introduced into the top of these holes. The partial oxidation of the layer converts the layer to one having a conducting region surrounded by an electrically insulating region, the conducting region being positioned under the top electrode.

DETAILED DESCRIPTION OF THE INVENTION

Figure 1:
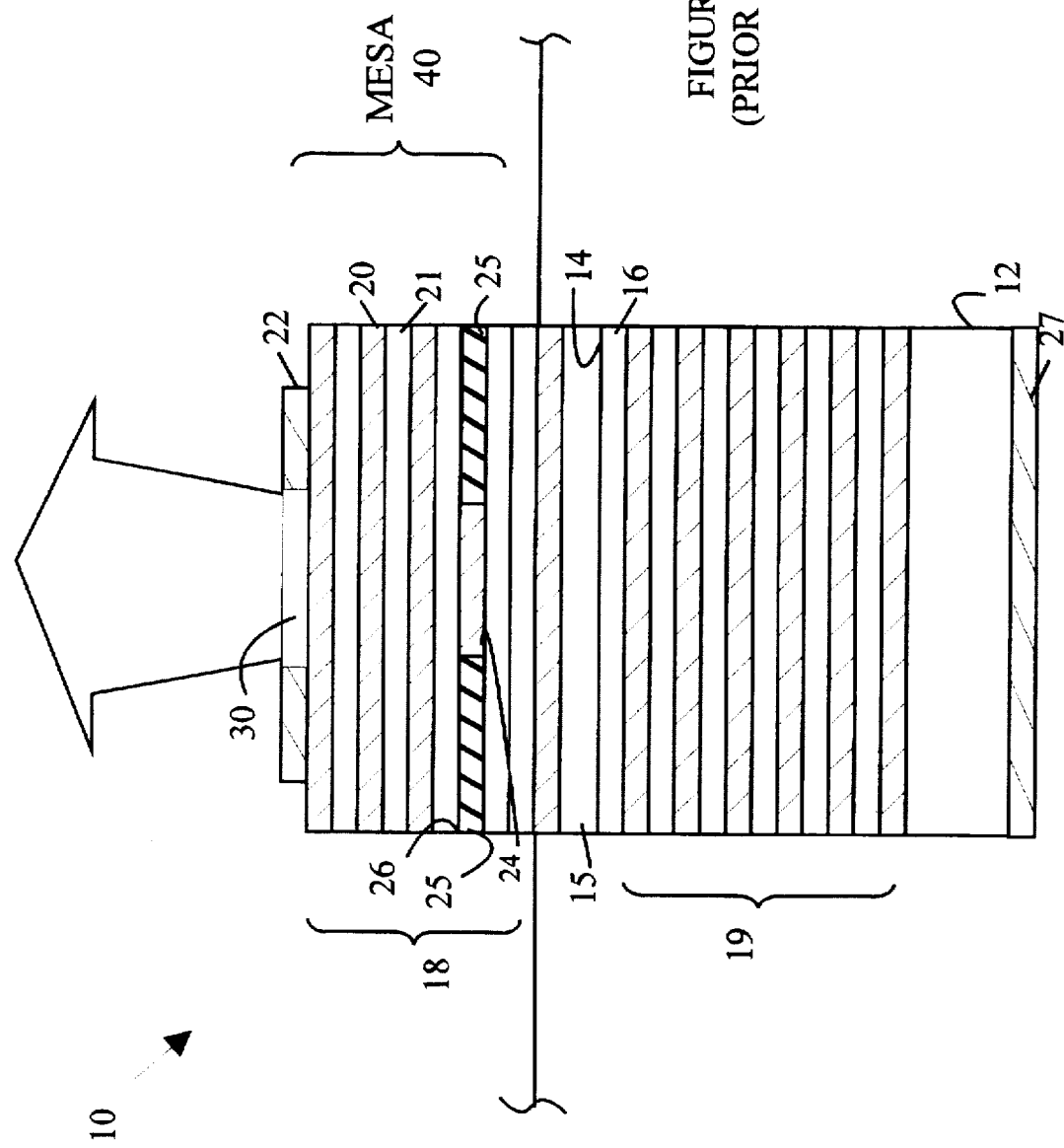
FIG. 1 is a cross-sectional view of a conventional native-oxide VCSEL.

The present invention may be more easily understood with reference to FIG. 1 which is a cross-sectional view of a conventional native oxide VCSEL 10. Since construction of VCSELs is well known to those skilled in the laser arts, it will not be described in detail here. For the purposes of this discussion, it is sufficient to note that VCSEL 10 may be viewed as a p-i-n diode having a top mirror region 18, a light generation region 14, and bottom mirror region 19. These regions are constructed on a substrate 12. Electrical power is applied between electrodes 22 and 27. The various layers are constructed by epitaxial growth. Substrate 12 is an n-type semiconductor in the example shown in FIG. 1.

The active region is typically constructed from one or more quantum wells of InGaAs, GaAs, AlGaAs, also (Al) GaInP, GaInAsP or InAlGaAs which is separated from mirror regions 18 and 19 by spacers 15 and 16, respectively. The choice of material depends on the desired wavelength of the light emitted by the VCSEL or other desired VCSEL properties. In addition, devices based on bulk active regions are known to the art. This layer 14 may be viewed as a light generation layer which generates light due to spontaneous and stimulated emission via the recombination of electrons and holes generated by forward biasing the p-i-n diode.

The mirror regions are constructed from alternating layers of which layers 20 and 21 are typical. These layers have different indices of refraction. The thickness of each layer is chosen to be one quarter of the wavelength of the light. The stacks form Bragg mirrors. The stacks are typically constructed from alternating layers of AlAs and GaAs or AlGaAs. To obtain the desired reflectivity, 20 to 30 pairs of layers are typically required. The layers in the upper mirror region 18 are typically doped to be p-type semiconductors and those in the lower mirror region 19 are doped to be n-type semiconductors. Substrate 12 is preferably n-type. Bottom electrode 27 is preferably an n-ohmic contact. However, n-i-p diode structures may also be constructed by growing the structures on a p-substrate or a semi-insulating substrate with a p-layer deposited thereon.

The current flow between electrodes 22 and 27 is confined to region 24 by an insulating region 25 produced by converting the outer portions of mirror layer 26 to an insulator as described below.

It should be noted that VCSEL 10 is not shown to scale in FIG. 1. In particular, the mirror regions and active regions have been expanded to provide clarity in the drawing. In practice, the thickness of region 12 is typically 150 µm compared to about 10 µm for the mirror and active regions. Window 30 in top electrode 22 is approximately 10 µm in diameter while bottom electrode 27 covers the bottom of the substrate.

In the VCSEL shown in FIG. 1, the light is emitted from the top surface of the VCSEL. However, designs in which the light is emitted through a transparent substrate are also known. It will be apparent to those skilled in the art from the following discussion that the teachings of the present invention may also be applied to such transparent substrate designs.

As noted above, the insulating region is created by converting the outer portion of one of the mirror layers. The conversion process is based on the observation that water vapor in an $N_2$ carrier gas at an elevated temperature, typically 400–450° C., will oxidize AlGaAs to form aluminum oxide. In general, the mirror layers can be constructed from layers of $Al_xGa_{1-x}As$. Layers that are to have high indices of refraction have x values of the order of 0.15. Layers that are to have low indices of refraction values have x values of the order of 0.9 or greater. The selective lateral oxidation of one of the layers is based on the observation that the rate at which steam oxidizes the $Al_xGa_{1-x}As$ depends critically on the value of x. For example, there is a factor of about 10 difference in the oxidation rate of $Al_xGa_{1-x}As$ between x values of 0.92 and 0.98. Hence, the layer that is to be partially oxidized typically has a relatively higher value of x (e.g., x=0.98) while the other low index of refraction layers are restricted to lower x values (e.g., x=0.92). Other values of x in either layer are also possible. Since this oxidation process is well known to those skilled in the art, it will not be discussed further here. The reader is referred to K. D. Choquette, R. P Schneider Jr, K. L. Lear, and K. M. Geils, *Electronics Letters* 30, p2043, 1994 for a more detailed discussion of the process.

As noted above, prior art fabrication methods for utilizing this oxidation reaction rely on introducing the steam along the outside of the mesas 40 so that the oxidation reaction proceeds from the outside inwards. This method of fabrication leads to steep mesa steps which can be several microns high, which cause problems in subsequent deposition phases of the fabrication. In addition, this prior art methodology limits the density of devices that can be fabricated on a chip.

Figure 2:
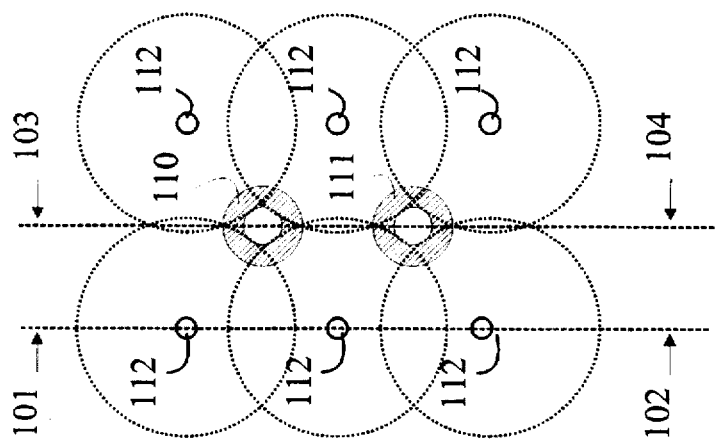
FIG. 2 is a top view of a portion of a chip 100 having two VCSELs with top electrodes.
Figure 3:
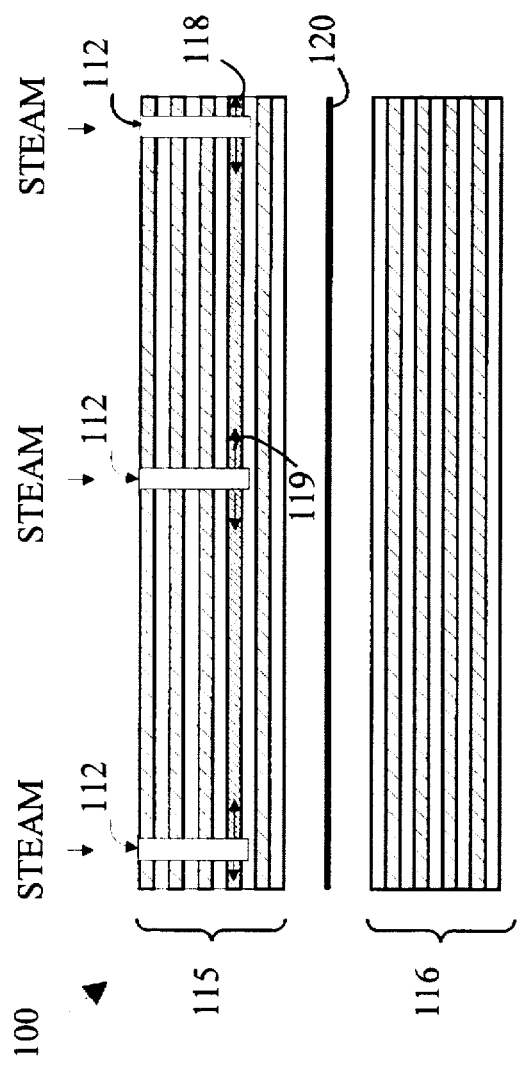
FIG. 3 is a cross-sectional view of chip 100 through section 101–102.
Figure 4:
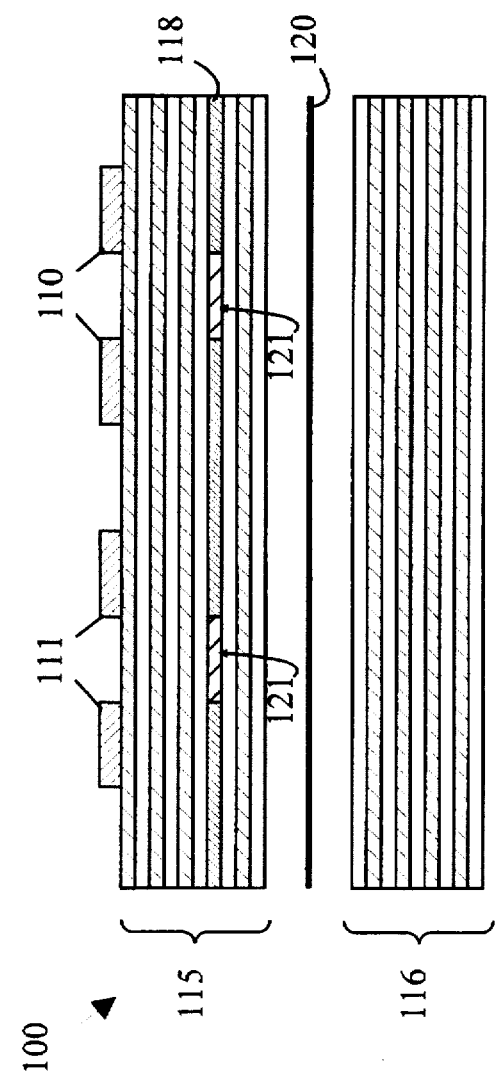
FIG. 4 is a cross-sectional view of chip 100 through section 103–104.

The present invention avoids these problems by utilizing etched holes to provide access to the layer that is to be oxidized. The manner in which the present invention operates may be more easily understood with reference to FIGS. 2–4. FIG. 2 is a top view of a portion of a chip 100 having two VCSELs whose top electrodes are shown at 110 and 111, respectively. FIG. 3 is a cross-sectional view of chip 100 through section 101–102. FIG. 4 is a cross-sectional view of chip 100 through section 103–104. Chip 100 includes a top mirror region 115, an active region 120, and a bottom mirror region 116. The top mirror region includes a plurality of alternating layers having different indices of refraction. One (or more) of these layers, shown at 118, has a higher Al content than the others, and hence, will be oxidized much faster than the others when exposed to water vapor.

A plurality of holes are etched into the top mirror region to provide access to layer 118. In one embodiment of the present invention, four circular holes are opened that are equidistant from the center of the top electrode of each of the devices. These holes are shown at 112. The holes extend from the top of chip 100 at least to layer 118. When the chip is exposed to steam, the steam enters these holes and a moving oxidation front is set up. The front proceeds radially from the holes as shown by the arrows 119. The process is allowed to continue until the fronts merge under each electrode leaving an unoxidized aperture 121 under each electrode.

While the above described embodiments of the present invention have utilized four etched holes for each VCSEL, it will be apparent to those skilled in the art from the above discussion that fewer holes may be utilized. For example, three holes located around each VCSEL will also provide a window under each electrode. Similarly, additional holes can be utilized to provide a more circular window. Finally, as is evident from FIGS. 2–4, a hole can be shared by more than one VCSEL in an array.

Figure 5:
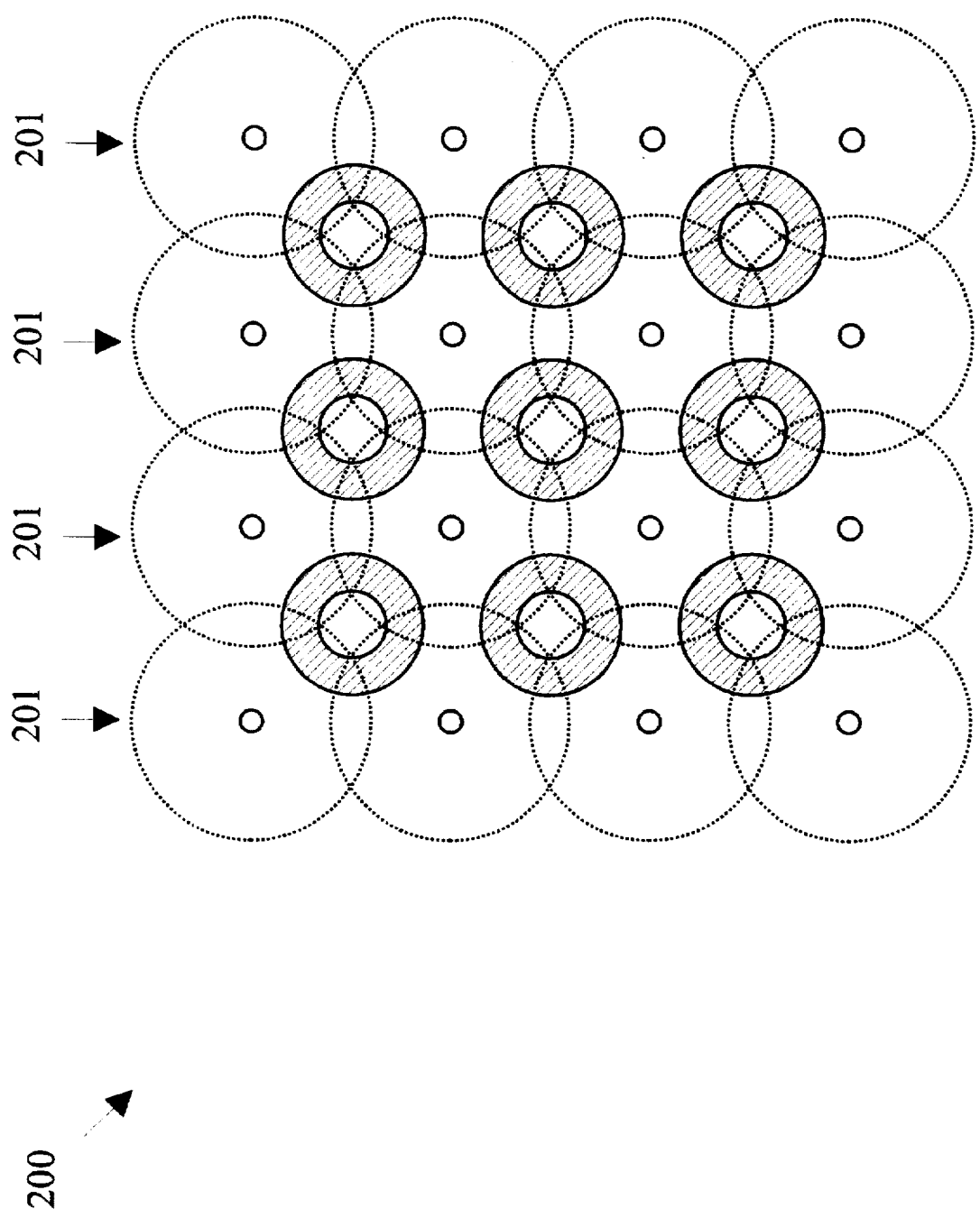
FIG. 5 is a top view of a two-dimensional array of VCSELs.

The sharing of holes makes the present invention particularly well suited to the construction of arrays of VCSELs. Refer to FIG. 5 which is a top view of a rectangular array 200 of VCSELs. The rows of etched holes are shown at 201. Each row of etched holes that is internal to the array is shared by two columns of VCSELs. Hence, an N×N array requires only (N+1)×(N+1) etched holes.

Although circular holes are shown in the drawings, holes with rectangular cross-sections are preferred. However, it will be apparent to those skilled in the art from the above description that the holes may have other shapes. By altering the shape and number of holes, the shape of the laser aperture may be controlled. The shape of the holes can be set by conventional photo-lithographic techniques. The etching of the holes can be performed with a 1:5:15 mixture of phosphoric acid ($H_3PO_4$), hydrogen peroxide ($H_2O_2$) and water ($H_2O$) which yields a non-selective etch rate of 1.5 µm/min to etch the holes. Other wet etches may be suitable. Alternatively, dry etching by reactive ion etching may be used to provide better accuracy and more vertical sidewalls.

When multiple VCSELs are constructed by the method of the present invention, additional isolation regions may be included to inhibit electrical and/or optical cross-talk between the VCSELs. Such isolation regions may be introduced by ion implantation or trenches etched between the devices. These techniques are known to those skilled in the art, and hence, will not be discussed in detail here. To simplify the drawings, such additional isolation regions have not been shown.

The above described embodiments of the present invention have a laser aperture defined by oxidizing a portion of a single mirror layer. However, it will be apparent to those skilled in the art from the above discussion that multiple mirror layers may be oxidized to provide laser apertures at various layers.

Various modifications to the present invention will become apparent to those skilled in the art from the foregoing description and accompanying drawings. Accordingly, the present invention is to be limited solely by the scope of the following claims.

What is claimed is:

1. A VCSEL comprising:

a top electrode, a top mirror having a top surface;

a light generation region;

a bottom mirror for reflecting light toward said top mirror, wherein at least one of said top mirror and said bottom mirror comprises a plurality of planar electrically conducting layers, at least one of said layers having a different index of refraction from the layers adjacent to that layer, and wherein a first one of said layers comprises an oxidizable material which is oxidized upon exposure to an oxidizing agent thereby converting said material to an electrical insulator; a bottom electrode;

first, second, and third etched holes connecting said top surface to said first one of said layers; and a conducting region positioned under said top electrode, said conducting region providing a conducting path between said top and bottom electrodes, said conducting region being adjacent to insulating layers extending radially from each of said etched holes, each of said insulating layers comprising a material generated by oxidizing said oxidizable material, and forming a portion of a boundary of said conducting path.

2. The VCSEL of claim 1 wherein said oxidizable material comprises $Al_xGa_{1-x}As$.

3. The VCSEL of claim 2 wherein said oxidizing agent comprises water.

4. The VCSEL of claim 1 wherein said etched holes have rectangular cross-sections.

5. An array of VCSELs, said array comprising first and second VCSELS, each of said VCSELs comprising:

a top electrode;

a top mirror having a top surface;

a light generation region;

a bottom mirror for reflecting light toward said top mirror, wherein at least one of said top mirror and said bottom mirror comprises a plurality of planar electrically conducting layers, at least one of said layers having a different index of refraction from the layers adjacent to that layer, and wherein a first one of said layers comprises an oxidizable material which is oxidized upon exposure to an oxidizing agent thereby converting said material to an electrical insulator; a bottom electrode; and a conducting region positioned under said top electrode, said conducting region providing a conducting path between said top and bottom electrodes, said array further comprising a hole extending from said top surface to said first one of said layers; and an insulating layer extending radially from said hole, said insulating layer comprising a material generated by oxidizing said oxidizable material, said insulating layer being in contact with said conducting regions of said first and second VCSELs and forming a portion of a boundary of said conducting path.

6. In a method for fabricating a VCSEL comprising a top electrode, a top mirror having a top surface, a light generation region and a bottom mirror for reflecting light toward said top mirror, wherein at least one of said top mirror and said bottom mirror comprises a plurality of planar electrically conducting layers, at least one said layer having a different index of refraction from the layers adjacent to that layer, and wherein a first one of said layers comprises an oxidizable material which is oxidized upon exposure to an oxidizing agent thereby converting said material to an electrical insulator; a bottom electrode, the improvement comprising the steps of:

etching first, second, and third holes connecting said top surface to said first one of said layers for exposing said first one of said layers to said oxidizing agent;

introducing said oxidizing agent into said first, second, and third etched holes for a time sufficient to generate a conducting region surrounded by an electrically insulating region, said conducting region being positioned under said top electrode.

7. The method of claim 6 wherein said oxidizable material comprises $Al_xGa_{1-x}As$.

8. The method of claim 7 wherein said oxidizing agent comprises water.

9. The method of claim 6 wherein said etched holes have rectangular cross-sections.

10. The method of claim 6 wherein:

said method is for fabricating an array of VCSELs including said VCSEL; and said first, second, and third etched holes are shared with others of said VCSELs constituting said array.

* * * * *